United States Patent [19]  [11] 4,036,932
Poiblaud  [45] July 19, 1977

[54] METHOD OF PREPARING GALLIUMPHOSPHIDE

[75] Inventor: Gérard Joseph Poiblaud, Epron-Thaon, France

[73] Assignee: U.S. Philips Corporation, New York, N.Y.

[21] Appl. No.: 613,246

[22] Filed: Sept. 15, 1975

[30] Foreign Application Priority Data

Sept. 18, 1974  France ................................ 74.31524

[51] Int. Cl.² .................... C09K 11/08; C01G 15/00
[52] U.S. Cl. ............................. 423/299; 252/301.4 P
[58] Field of Search ................. 423/299; 252/301.4 P

[56] References Cited

U.S. PATENT DOCUMENTS 3,366,454  1/1968  Folberth et al. ...................... 423/299
3,617,371  11/1971  Burmeister .......................... 423/299
3,690,846  9/1972  Akai et al. ........................... 423/299

OTHER PUBLICATIONS

Ringel, Synthesis of Gallium Phosphide, Journal of the Electrochemical Society, Apr. 1971, pp. 609-613.

*Primary Examiner*—O. R. Vertiz
*Assistant Examiner*—Gregory A. Heller
*Attorney, Agent, or Firm*—Frank R. Trifari; Norman N. Spain

[57] ABSTRACT

Method of preparing gallium phosphide having a low content of residual impurities by contacting phosphorus vapor in a closed space with a gallium bath which is subjected to a temperature gradient.

A nitrogen source, preferably in the form of phosphorus nitride, is placed in the space.

8 Claims, No Drawings

METHOD OF PREPARING GALLIUMPHOSPHIDE

The present invention relates to a method of preparing gallium phosphide having a low concentration of residual impurities. According to this method vapours comprising phosphorus are contacted in a closed space with liquid gallium which is subjected to a temperature gradient.

The dissociation pressure of gallium phosphide at the melting temperature being very high, the preparation of gallium phosphide is preferably carried out at a lower temperature by contacting vapours containing phosphorus with a liquid gallium mass which is subjected to a temperature gradient, preferably in a closed space. The purity of the material which is obtained by said preparation is of importance for electroluminescent applications in which the material may be used as a source for an epitaxial deposition, as a starting material for monocrystalline growth, or for serving directly as a substrate. The quantum efficiency of the electroluminescent devices manufactured from said material is in all cases a function of the purity of the crystals. In particular, the complexes of vacancies in the crystal lattice with impurities, for example, silicon and sulphur, are non-radiation recombination centres which reduce the quantum efficiency of the device.

Since the apparatus used is usually of silicon oxide, a residual doping with silicon is a frequently occurring cause of poor results, the more so because the preparation is a long-lasting operation which is carried out at a high temperature.

Experiments have been performed to reduce the contamination of gallium phosphide by silicon during the formation. In an article in the periodical "Journal of the Electrochemical Society" of April, 1971, pp. 609–613, C.M. Ringel suggests to use helium as a carrier gas for phosphorus vapour and to add water vapour to said carrier gas. However, helium is an expensive gas and further the contamination by silicon is only partly reduced. In addition, this method of checking the contamination by silicon can be used only in the preparation in an open tube the efficiency of which is low.

It is a particular object of the present invention to reduce the drawbacks of the known above-described method and to enable the preparation of gallium phosphide with a low content of residual impurities which may serve in particular for the manufacture of the electroluminescent devices of high quantum efficiency.

Another object of the invention is to prevent the contamination by silicon during the preparation of the gallium phosphide in an apparatus which comprises a closed silicon oxide envelope.

According to the invention, gallium phosphide having a low concentration of residual impurities is prepared according to the method in which vapors containing phosphorus are contacted with liquid gallium while being subjected to a temperature treatment in a closed space, is characterized in that in addition to the phosphorus and gallium sources, a nitrogen source in the condensed state is placed in the closed space.

Applicants have established that the addition of nitrogen during the preparation involves an incorporation of the thus released nitrogen in the lattice of crystallized gallium phosphide and a considerable reduction of the content of residual impurities. The presence of nitrogen in phosphorus places in the crystal lattice of the gallium phosphide restricts the incorporation of impurities which contribute to the formation of the non-radiation recombination centres, and in particular of silicon. The nitrogen thus introduced contributes to the introduction of radiation recombination centres.

The use of nitrogen is known as a dopant of gallium phosphide during the growth stage of a single crystal starting from a polycrystal of the same compound during an epitaxial deposit, especially to obtain a green luminescence, but said incorporation is carried out in a material already containing undesired impurities in the crystal lattice thereof, especially silicon which itself originates from the polycrystalline material. The invention endeavours on the contrary to prevent the incorporation of said undesired impurities by replacing them by nitrogen during the phase of the formation of the compound from the composing elements.

According to a preferred embodiment, nitrogen in the form of a nitride in the solid state is brought to a temperature at which dissociation occurs in the space in which the preparation takes place.

The phosphorus vapour source usually being pure red phosphorus, the nitride added as a nitrogen source is a dissociable phosphorus nitride. Particularly useful is the phosphorus para nitride $(PN)_n$. This nitride can be obtained in a great purity and does not involve any undesired impurity which can prevent the effect of the incorporation of nitrogen in the formed compound.

The phosphorus nitride and phosphorus can be mixed and for the preparation the entire mixture of the two substances is brought to a sublimation temperature of phosphorus, but the addition of nitrogen will be more efficient when the phosphorus nitride is brought to a higher temperature which is between the sublimation temperature of phosphorus and the maximum temperature of the liquid gallium.

Preferably used is the method described in French Patent Application Nr. 7,401,442 filed by Applicants on Jan. 16, 1974 under the title "Method of preparing III-V-compounds". Because the phosphorus is brought at least to 500° C and the gallium at a temperature between, for example, 900° and 1150° C, the phosphorus nitride is brought to a temperature which is between 500° and 1150° C and preferably at 900° C.

According to a modification of the embodiments of the method according to the invention the nitrogen source consists of gallium nitride. The gallium nitride is added to the gallium mass and the solution is brought at the absorption temperature of phosphorus as in the known method. In the case in which the method described in the above-mentioned patent application is used, the liquid mass is subjected to a temperature gradient between, for example, 900° and 1200° C.

In an example according to the invention, a preparation of gallium phosphide is carried out by treatment in known manner as follows: in a 2000 cm³ quartz ampoule which is properly cleaned and dried in vacuum are placed 450 to 600 g of gallium, purity 99.9999%, 100 g of red phosphorus and 200 to 300 mg of phosphorus nitride PN. The ampoule is sealed in a vacuum of $10^{-6}$ Torr. The gallium is divided over two identical boats which are placed in symmetrical temperature gradients of 900° to 1200° C. The phosphorus nitride is placed in the proximity of the gallium at a point where the temperature is in the order of 800° C. The phosphorus is placed at an extremity of the ampoule which is brought at 550° C and the opposite extremity of the ampoule is maintained at 420° C, which ensures a pressure of 1 atmosphere in the ampoule. When all the phosphorus has sublimated the temperatures of the extremities are reversed until the phosphorus is exhausted, the overall preparation time being in the order of 40 hours. The resulting gallium phosphide has a nitrogen content which is higher than $10^{17}$ atoms per cm$^3$, it has n-type conductivity, a high resistivity, a mobility of the electrons in the order of 200 and 2000 cm$^2$, $V^{-1} s^{-1}$ at 300° Kelvin and at 77° Kelvin and the concentration of carriers as a result of residual impurities of the n-type is at least lower than $10^{16}$ per cm$^3$.

What is claimed is:

1. In the method of preparing gallium phosphide by contacting, in a closed space subjected to a temperature gradient, liquid gallium with phosphorus vapors and recovering the resultant crystalline gallium phosphide, the improvement wherein a nitrogen compound in the condensed state is placed in said space and is subjected to a temperature higher than its dissociation temperature but below the maximum temperature of liquid gallium, said nitrogen compound liberating nitrogen in said temperature range thereby incorporating a slight amount of nitrogen in the crystal lattice of said gallium phosphide and preventing contamination of said gallium phosphide crystal lattice by sulfur and silicon impurities.

2. The method of claim 1 wherein the condensed nitrogen compound is a solid nitride.

3. A method as claimed in claim 2, characterized in that the nitrogen source consists of gallium nitride which is added to the liquid gallium mass.

4. A method as claimed in claim 2, characterized in that the nitride is phosphorus nitride.

5. A method as claimed in claim 4, characterized in that the phosphorus nitride is maintained at a temperature between the sublimation temperature of phosphorus and the maximum temperature of liquid gallium.

6. A method as claimed in claim 4, characterized in that the phosphorus nitride and phosphorus are mixed and brought at the same temperature.

7. A method as claimed in claim 4, characterized in that the nitride is phosphorus para nitride of formula $(PN)_n$.

8. A method as claimed in claim 4, characterized in that, the phosphorus source is red phosphorus which is brought at a temperature between 500° and 550° C, the gallium is subjected to a temperature gradient of 900 to 1150° C, the space comprises a cold point of 420° C and phosphorus nitride is maintained at a temperature between 500° and 1150° C.

* * * * *